US006512268B1

(12) United States Patent
Ueno

(10) Patent No.: US 6,512,268 B1
(45) Date of Patent: Jan. 28, 2003

(54) SUPER-JUNCTION SEMICONDUCTOR DEVICE

(75) Inventor: Katsunori Ueno, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/644,157

(22) Filed: Aug. 23, 2000

(30) Foreign Application Priority Data

Aug. 23, 1999 (JP) .......................................... 11-235174
Jun. 23, 2000 (JP) ....................................... 2000-189590

(51) Int. Cl.⁷ .................... H01L 29/76; H01L 29/94; H01L 31/062; H01L 31/113; H01L 31/119
(52) U.S. Cl. ...................................... 257/341; 257/401
(58) Field of Search .............................. 257/133, 135, 257/192, 401, 204, 206, 339, 341–343, 511; 327/434; 438/153, 154

(56) References Cited

U.S. PATENT DOCUMENTS

| | | | | |
|---|---|---|---|---|
| 4,757,362 A | * | 7/1988 | Biwa | 357/23.8 |
| 5,216,275 A | * | 6/1993 | Chen | 257/493 |
| 5,438,215 A | * | 8/1995 | Tihanyi | 257/401 |
| 5,641,982 A | * | 6/1997 | Takahashi | 257/398 |
| 6,081,009 A | * | 6/2000 | Neilson | 257/341 |
| 6,097,063 A | * | 8/2000 | Fujihara | 257/339 |

OTHER PUBLICATIONS

S. Wolf, SDilicon Processing, Lattice Press, vol. 3, pp. 85–89.*

* cited by examiner

Primary Examiner—Michael Sherry
Assistant Examiner—Asok Kumar Sarkar
(74) Attorney, Agent, or Firm—Rossi & Associates

(57) ABSTRACT

The super-junction semiconductor device includes an alternating conductivity type layer including n-type drift regions and p-type partition regions laminated alternately with each other outside the active region of the device. A first FP electrode is formed above n-type drift region with an insulation film interposed therebetween. The first FP electrode is made contact with the surface of p-type partition region or floated from p-type partition region. The FP electrode may be extended over a plurality of n-type drift regions. Resistance is arranged between the adjacent FP electrodes. An n-type stopper region is formed vertically through the second alternating conductivity type layer outside the active region and deeply enough to reach the layer with low electrical resistance.

22 Claims, 11 Drawing Sheets

GUARD RING STRUCTURE

FIELD PLATE STRUCTURE

SUPER-JUNCTION SEMICONDUCTOR DEVICE

FIELD OF THE INVENTION

The present invention relates to semiconductor devices such as MOSFET's (insulated gate field effect transistors), IGBT's (insulated gate bipolar transistors), bipolar transistors and diodes having a vertical semiconductor structure including an alternating conductivity type layer that provides a current path in the ON state of the devices and is depleted in the OFF state of the devices.

BACKGROUND

A semiconductor device may be roughly classified as a lateral semiconductor device that arranges its electrodes on a major surface or a vertical semiconductor device that distributes its electrodes on both major surfaces facing opposite to each other. When the vertical semiconductor device is ON, a drift current flows in the thickness direction of the semiconductor chip (vertical direction). When the vertical semiconductor device is OFF, the depletion layers caused by application of a reverse bias voltage expands in the vertical direction. In order to provide a vertical semiconductor device with a high breakdown voltage, in that the current flows between the opposite-facing electrodes on the major surfaces, it is necessary to increase the specific resistance of the highly resistive layer between the opposite-facing electrodes and to thicken the highly resistive layer.

FIG. 10 shows a perspective cross sectional view of a conventional vertical MOSFET as an example of a power device. Referring now to FIG. 10, the vertical MOSFET includes a highly resistive n-type drift layer 2, p-type well regions 3 in the surface portion of n-type drift layer 2, and n$^+$-type source regions 4 in p-type well regions 3. Trenches 9 are dug from the surfaces of n$^+$-type source regions 4 down to n-type drift layer 2. A gate electrode 6 is buried in trench 9 with a gate insulation film 5 interposed therebetween. A source electrode contacts with p-type well regions 3 and n$^+$-type source regions 4. A drain electrode contacts with a drain layer 1.

In the vertical semiconductor device as shown in FIG. 10, highly resistive n-type drift layer 2 works as a region for making a drift current flow vertically when the MOSFET is in the ON-state. In the OFF-state of the MOSFET, depletion layers expand from the pn-junctions between p-type well regions 3 and n-type drift layer 2 into n-type drift layer 2, resulting in a high breakdown voltage of the MOSFET. Thinning highly resistive n-type drift layer 2 (shortening the current path in highly resistive n-type drift layer 2) is effective for substantially reducing the on-resistance (resistance between the drain and the source) of the MOSFET, since the drift resistance is lowered in the ON-state of the device. However, the short current path in n-type drift layer 2 causes breakdown at a low voltage and the breakdown voltage (the voltage between the source and the drain) is lowered, since the expansion widths of the depletion layers expanding from the pn-junctions between p-type well regions 3 and n-type drift layer 2 are narrowed and the electric field strength in the depletion layers soon reaches the maximum (critical) value for silicon. However, in the semiconductor device with a high breakdown voltage, a thick n-type drift layer 2 inevitably causes high on-resistance and loss increase. In short, there exists a tradeoff relation between the on-resistance (current capacity) and the breakdown voltage of the MOSFET. The breakdown voltage is sustained by the depletion layers expanding from the pn-junctions between p-type well regions 3 and n-type drift layer 2. The breakdown voltage increases as the impurity concentration in n-type drift layer 2 is lower and n-type drift layer 2 is thicker.

The on-resistance $R_{ON}A$ and the breakdown voltage $V_B$ of the vertical MOSFET are related with each other by the following relational expression (1) (cf. Hu. C., Rec. Power Electronics Specialists Conf., San Diego, (1979), p 385).

$$R_{ON}A=(27/8)(V_B^2/\mu \in E_C^3) \quad (1)$$

Here, $\mu$ is electron mobility, $\in$ is dielectric permeability of a semiconductor, and $E_C$ a maximum electric filed strength. The on-resistance $R_{ON}A$ is proportional to the square of the breakdown voltage $V_B$ and increases quickly with increase of the breakdown voltage $V_B$.

Increase of the on-resistance with increase of the breakdown voltage poses a serious problem not only on the MOSFET's but also on the power devices, including a drift layer and exhibiting a high breakdown voltage, such as IGBT's, bipolar transistors and diodes. Recently, a new junction structure has been proposed to obviate the problem described above (cf. G. Deboy et al., "A new generation of high voltage MOSFETs breaks the limit line of silicon", Technical digest of IEDM '98 (1998), pp. 683–685, European Patent 0 053 854, U.S. Pat. No. 5,216,275, U.S. Pat. No. 5,438,215, and Japanese Unexamined Laid Open Patent Application H09(1997)-266311). The proposed semiconductor devices include an alternating conductivity type drift layer formed of heavily doped n-type regions and p-type regions alternately laminated with each other. The alternating conductivity type drift layer provides a current path in the ON-state of the device and is depleted to bear the breakdown voltage in the OFF-state of the device.

Hereinafter, the semiconductor device including an alternating conductivity type drift layer will be referred to as the "semiconductor device with a super-junction structure" or as the "super-junction semiconductor device".

FIG. 11 is a perspective cross sectional view of a vertical MOSFET having a super-junction structure. Referring now to FIG. 11, the vertical MOSFET of FIG. 11 is different from the vertical MOSFET of FIG. 10 in that the vertical MOSFET of FIG. 11 includes a drift layer 12, that is not a single-layered one but formed of n-type drift regions 12a and p-type partition regions 12b alternately laminated with each other. In the figure, p-type well regions 13, n$^+$-type source regions 14, gate insulation films 15, and gate electrodes 16 are shown. A source electrode contacts with p-type well regions 13 and n$^+$-type source regions 14. A drain electrode contacts with a drain layer 11.

In the structure shown in FIG. 11, the on-resistance $R_{ON}A$ and the breakdown voltage $V_B$ of the vertical MOSFET are related with each other by the following relational expression (2) (cf. T. Fujihira "Theory of Semiconductor Super-junction Devices" Jpn. J. Appl. Phys. Vol. 36 (1997), pp. 6254–6262).

$$R_{ON}A=4d(V_B/\mu E_C^2) \quad (2)$$

Here, d is the width of n-type drift region 12a.

As the relational expression (2) indicates, the on-resistance $R_{ON}A$ of the super-junction semiconductor device increases in proportion to the breakdown voltage $V_B$ and more slowly than in the conventional semiconductor structure, the on-resistance $R_{ON}A$ thereof is related with the breakdown voltage $V_B$ by the relational expression (1).

FIG. 12 is a graph relating the breakdown voltage and the on-resistance for the super-junction semiconductor devices.

In the figure, the horizontal axis represents the breakdown voltage $V_B$ and the vertical axis the on-resistance $R_{ON}A$.

The ▲ marks represent the simulated values for the super-junction semiconductor device including n-type drift regions 12a of 50 nm in width, the ● marks the simulated values for the super-junction semiconductor device including n-type drift regions 12a of 500 nm in width, and the ■ marks the simulated values for the super-junction semiconductor device including n-type drift regions 12a of 5 $\mu$m in width. For the sake of comparison, the relation between the breakdown voltage and the on-resistance of the conventional semiconductor device including a single-layered drift layer is described by a broken line in FIG. 12.

For example, the on-resistance of the super-junction semiconductor device exhibiting the breakdown voltage of 1000 V and including n-type drift regions 12a, each 5 $\mu$m in width, 60 $\mu$m in thickness, and the impurity concentration therein is $5 \times 10^{15}$ cm$^{-3}$, is less than one tenth as large as that of the conventional semiconductor device.

Drift layer 12 is formed in the following way. At first, a highly resistive n-type layer is grown epitaxially on an n$^+$-type drain layer 11. The n-type drift regions 12a are formed by etching the highly resistive n-type layer to form trenches down to n$^+$-type drain layer 11. Then, p-type partition regions 12b are formed by epitaxially growing p-type layers in the trenches.

In the conventional power devices, a breakdown withstanding structure for sustaining the breakdown voltage such as a guard ring and a field plate is usually formed in the peripheral portion of the semiconductor device.

FIG. 13(a) is a cross sectional view of the semiconductor device including a guard ring. FIG. 13(b) is a cross sectional view of the semiconductor device including a field plate. In these figures, the edge of the depletion layer expanded by a voltage applied from a power supply in the left hand side of the figures is shown by a broken curve.

The breakdown withstanding structure facilitates expanding the depletion layer, preventing the electric field from localizing to the surface of the semiconductor device and raising the breakdown voltage to an ideal value, that the pn-junctions can provide.

The foregoing patent specifications and reports describe the active portion, through that a main current flows, of the alternating conductivity type drift layer. However, the foregoing patent specifications and reports do not describe anything on the breakdown withstanding structure, that is usually formed to realize a high breakdown voltage.

The semiconductor device, that includes an alternating conductivity type drift layer but lacks any breakdown withstanding structure, fails to realize a high breakdown voltage. Moreover, since the fundamental junction structure in the super-junction semiconductor device is different from the conventional junction structure, the conventional guard ring structure and the conventional field plate structure are not applicable, without modification, to the super-junction semiconductor device.

In view of the foregoing, it is an object of the invention to provide a super-junction semiconductor device that facilitates preventing the electric field from localizing and realizing a high breakdown voltage.

SUMMARY OF THE INVENTION

According to an aspect of the invention, there is provided a super-junction semiconductor device including: a semiconductor chip having a first major surface and a second major surface facing opposite to the first major surface, the semiconductor chip including an active region and a peripheral region surrounding the active region; a first main electrode and a second main electrode on the first major surface on the active region; a third main electrode on the second major surface; a layer with low electrical resistance extending on the side of the second major surface from the active region to the peripheral region; a first alternating conductivity type layer on the layer with low electrical resistance in the active region, the first alternating conductivity type layer providing a current path in the ON-state of the semiconductor device and being depleted in the OFF-state of the semiconductor device, the first alternating conductivity type layer being formed of drift regions of a first conductivity type and partition regions of a second conductivity type, the drift regions and the partition regions being laminated alternately with each other; and a second alternating conductivity type layer on the layer with low electrical resistance in the peripheral region, the second alternating conductivity type layer being formed of drift regions of the first conductivity type and partition regions of the second conductivity type, the drift regions and the partition regions being laminated alternately with each other. Advantageously, the drift regions and the partition regions in the first alternating conductivity type layer and the drift regions and the partition regions in the second alternating conductivity type layer extend in perpendicular to the first major surface.

Advantageously, the first alternating conductivity type layer and the second alternating conductivity type layer are continuous to each other.

Since depletion layers expand from multiple pn-junctions into the drift regions and the partition regions, resulting in depletion of not only the outer region but also the second major surface side region due to the arrangement of the second alternating conductivity type layer around the active region, the breakdown voltage of the peripheral region of the semiconductor device is improved.

Advantageously, the impurity concentrations in the drift regions and the partition regions in the second alternating conductivity type layer are equal to the respective net impurity concentrations in the drift regions and the partition regions in the first alternating conductivity type layer. Advantageously, the drift regions and the partition regions in the second alternating conductivity type layer and the drift regions and the partition regions in the first alternating conductivity type layer are shaped with respective planar stripes extending in parallel to each other. Advantageously, the widths of the drift regions and the partition regions in the second alternating conductivity type layer are almost equal to the respective widths of the drift regions and the partition regions in the first alternating conductivity type layer.

The curved electric line of force extending from the side portion of the active region to the layer with low electric resistance on the side of the second major surface via the peripheral region is longer than the straight electric line of force extending from the first major surface side of the active region to the layer with low electric resistance on the side of the second major surface via the first alternating conductivity type layer. Since the depletion electric field strength is lower in the second alternating conductivity type layer than in the first alternating conductivity type layer in the active region even when the impurity concentrations in the drift regions and the partition regions in the second alternating conductivity type layer are equal to the respective impurity concentrations in the drift regions and the partition regions in the first alternating conductivity type layer due to the longer electric line of force in the peripheral region, the breakdown voltage is higher in the peripheral region than in the active region. Since a certain high breakdown voltage is guaranteed for the peripheral region of the super-junction semiconductor device including a first alternating conductivity type layer formed of alternately laminated n-type drift regions and p-type partition regions extending vertically, the structure of the first alternating conductivity type layer is optimized easily, the freedom for designing super-junction semiconductor devices is increased and practical super-junction semiconductor devices are developed.

Preferably, the impurity amounts in the second alternating conductivity type layer in the peripheral region are smaller than the impurity amounts in the first alternating conductivity type layer in the active region. Since the second alternating conductivity type layer in the peripheral region is depleted more easily than the first alternating conductivity type layer in the active region due to the impurity distribution described above, the breakdown voltage is surely higher in the peripheral region than in the active region.

Advantageously, the drift regions in the first alternating conductivity type layer and in the second alternating conductivity type layer or the partition regions in the first alternating conductivity type layer and in the second alternating conductivity type layer are located at the lattice points of a planar polygonal lattice such as a triangular lattice, a rectangular lattice and a hexagonal lattice. The arrangements described above make it easier to form the first alternating conductivity type layer and the second alternating conductivity type layer.

Advantageously, the super-junction semiconductor device further includes an insulation film covering at least a part of the second alternating conductivity type layer. Advantageously, the super-junction semiconductor device further includes an insulation film covering the adjacent portion of the second alternating conductivity type layer adjacent to the first alternating conductivity type layer, the insulation film being covered by the second main electrode. Advantageously, the super-junction semiconductor device further includes one or more insulation films on the second alternating conductivity type layer and one or more field plate electrodes on the one or more insulation films. Advantageously, the one or more field plate electrodes are in contact with the respective one or more partition regions in the second alternating conductivity type layer. Advantageously, the one or more field plate electrodes are extended over one or more drift regions in the second alternating conductivity type layer. Advantageously, the potential of each of the one or more field plate electrodes is floated.

By biasing each of the one or more field plate electrodes at an appropriate potential, depletion layers expand into the drift regions below the field plate electrodes when a voltage is applied, electric field is prevented from localizing around the electrode edge in the active region, and the surface electric field is relaxed.

Advantageously, the super-junction semiconductor device further includes a resistive film between the adjacent field plate electrodes. Advantageously, the super-junction semiconductor device further includes an insulation film on the second alternating conductivity type layer and a resistive film on the insulation film.

By connecting two field plate electrodes with a resistive film, the potentials of the field plate electrodes are fixed. The resistive film formed above the second alternating conductivity type layer with the insulation film interposed therebetween facilitates providing a uniform potential distribution throughout the second alternating conductivity type layer.

Advantageously, the super-junction semiconductor device further includes a channel stopper region of the first conductivity type in the outer portion of the peripheral region. Advantageously, the super-junction semiconductor device further includes a channel stopper region of the first conductivity type, the channel stopper region extending in perpendicular to the stripes of the drift regions and the partition regions in the first alternating conductivity type layer and in the second alternating conductivity type layer. Advantageously, the channel stopper region is extended deeply enough to reach the layer with low electrical resistance. Advantageously, the channel stopper region and the partition regions form pn-junctions therebetween. Advantageously, one or more of the partition regions are surrounded by the channel stopper region and the drift regions in a cross section parallel to the first major surface. Advantageously, the impurity concentration in the channel stopper region is equal to or lower than the impurity concentration in the drift regions.

If the side face of the alternating conductivity type layer is left untreated after being cut by dicing, a leakage current will flow from the as cut face to the source electrode via the partition regions, causing leakage current increase. The channel stopper region of the first conductivity type prevents the leakage current from increasing. The arrangement of the multiple channel stopper regions facilitates providing the semiconductor device with a high breakdown voltage more securely.

BRIEF DESCRIPTION OF THE DRAWING FIGURES

DETAILED DESCRIPTION OF THE PREFERRED EMBODIMENTS

Now the present invention will be described hereinafter with reference to the accompanied drawing figures which illustrate the preferred embodiments of the invention. In the following, the n-type layer or the n-type region is a layer or a region, in that electrons are the majority carriers. The p-type layer or the p-type region is a layer or a region, in that holes are the majority carriers. The $n^+$-type region or the $p^+$-type region is a region doped relatively heavily.

First Embodiment

Figure 1:
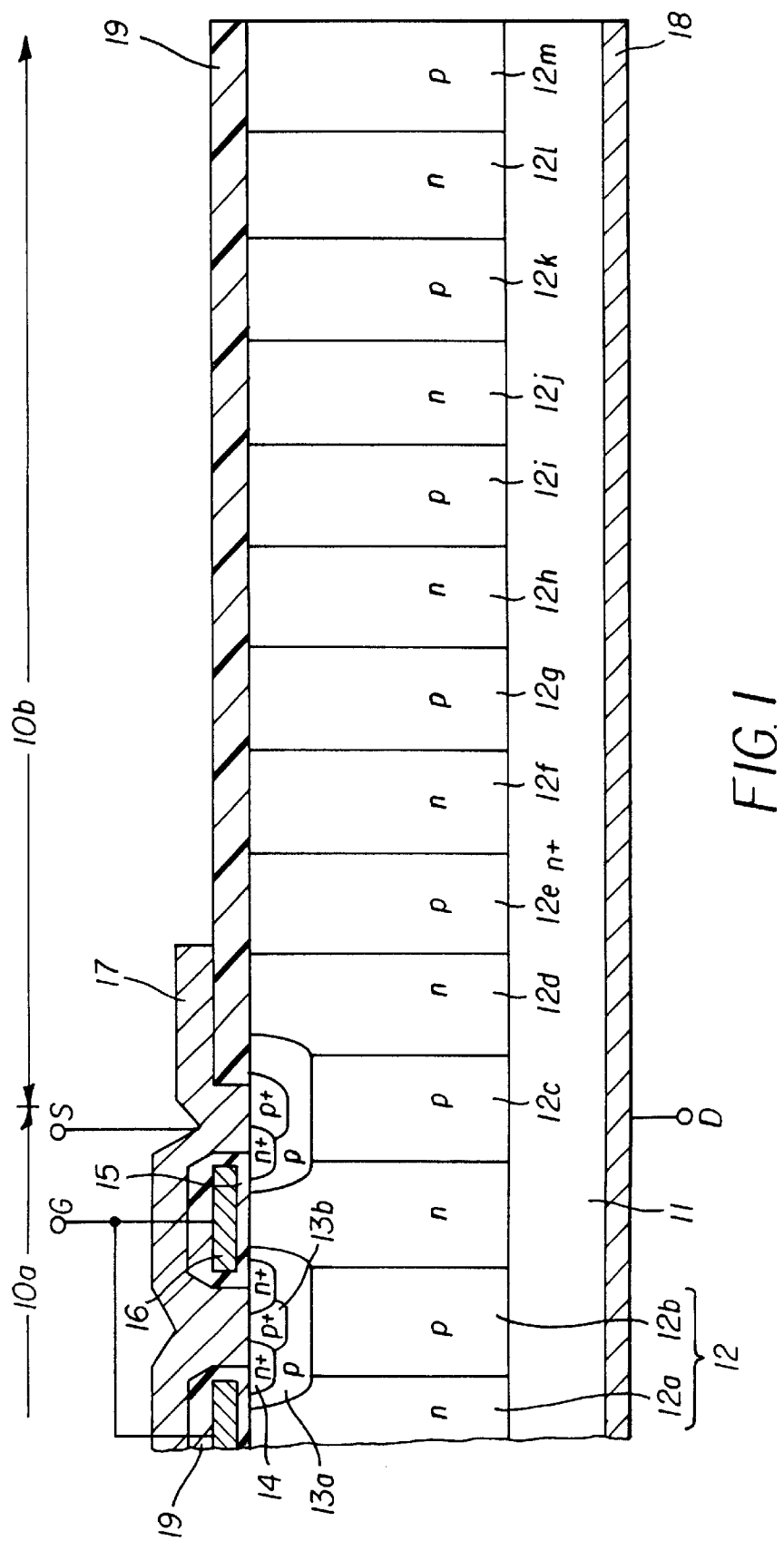
FIG. 1 is a cross sectional view of the peripheral portion of a vertical super-junction semiconductor device according to a first embodiment of the invention.
Figure 11:
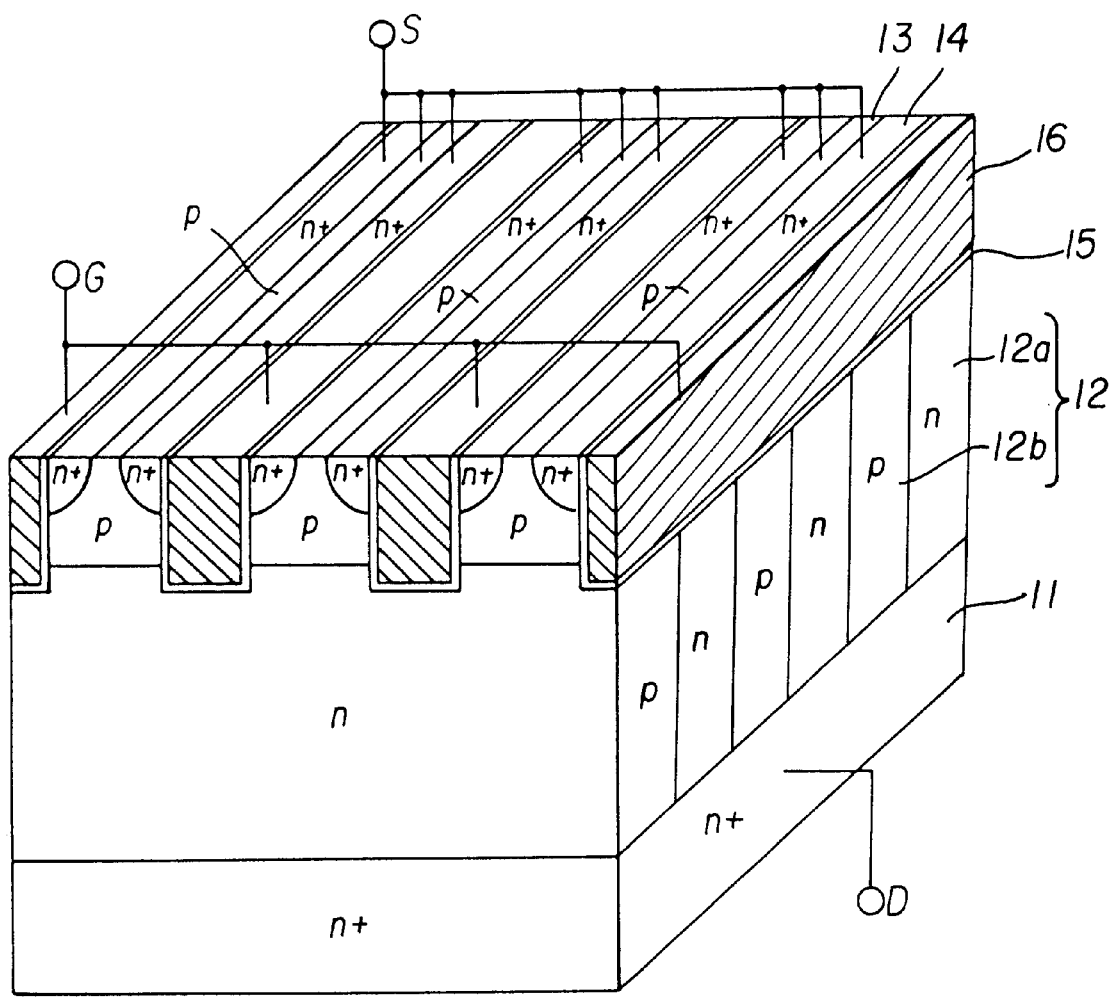
FIG. 11 is a perspective cross sectional view of a vertical MOSFET having a super-junction structure.
Figure 12:
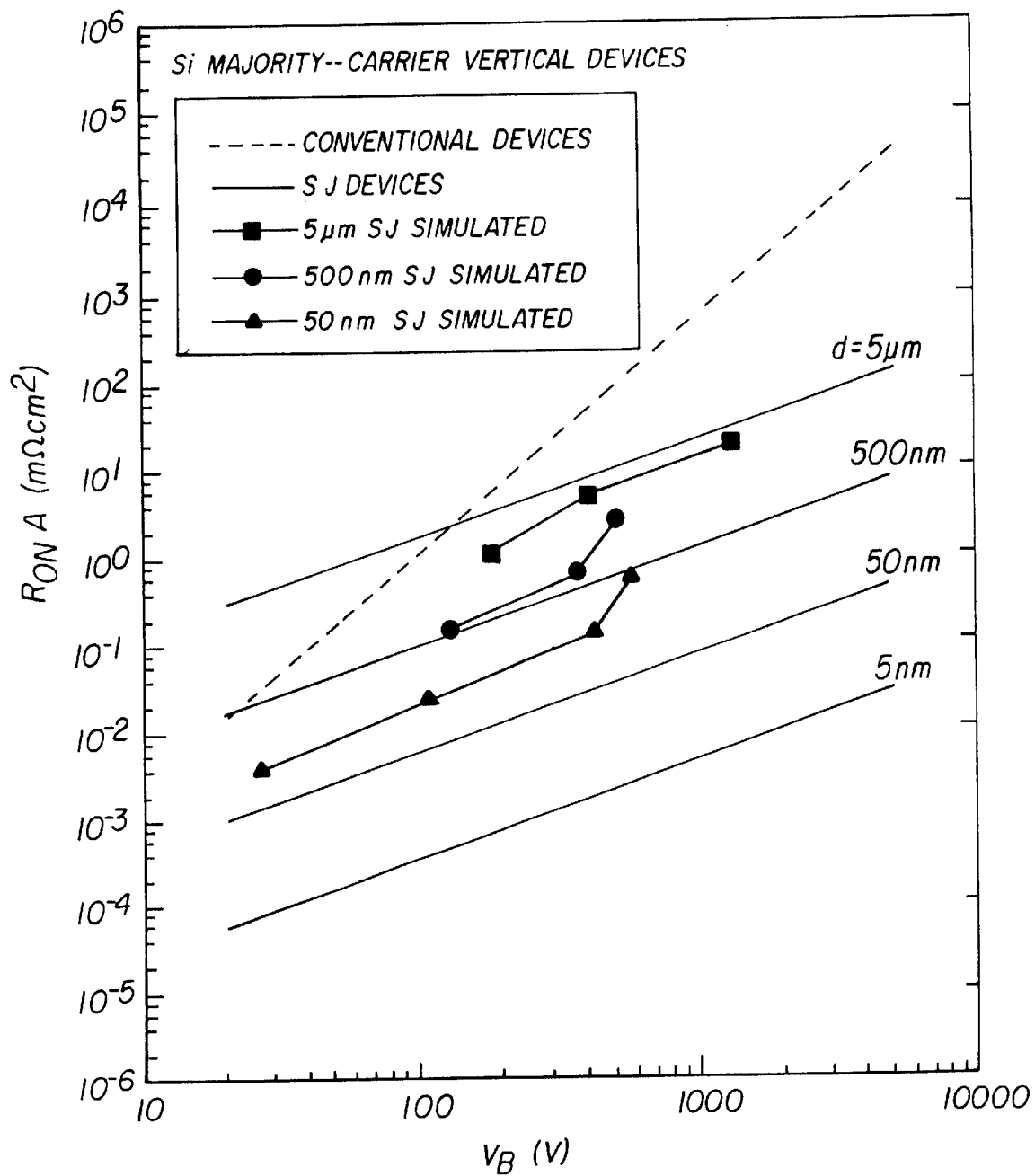
FIG. 12 is a graph relating the breakdown voltage and the on-resistance for the super-junction semiconductor devices.
Figure 13A:
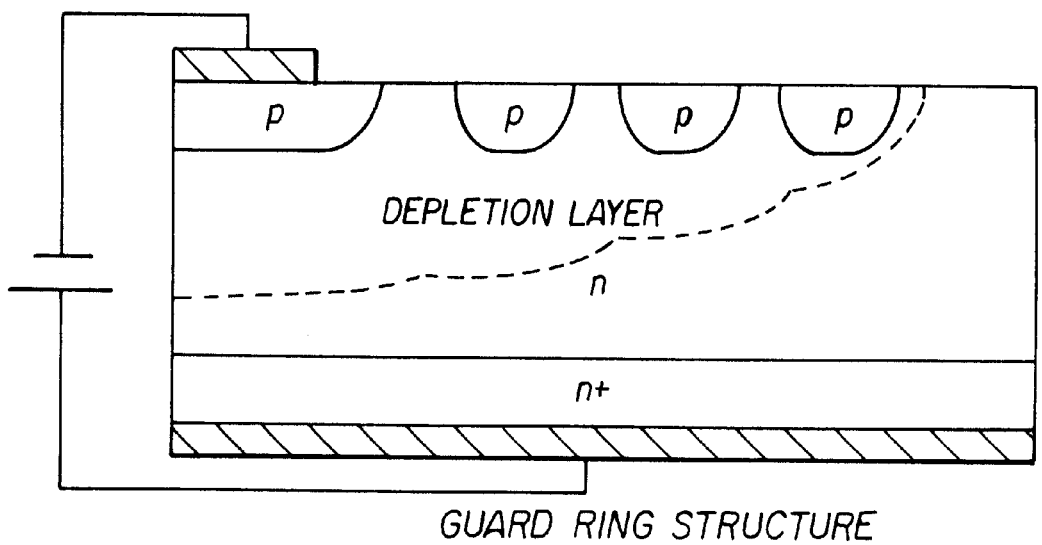
FIG. 13 (*a*) is a cross sectional view of a semiconductor device including a guard ring.
FIG. 13(b) is a cross sectional view of a semiconductor device including a field plate.
Figure 13B:
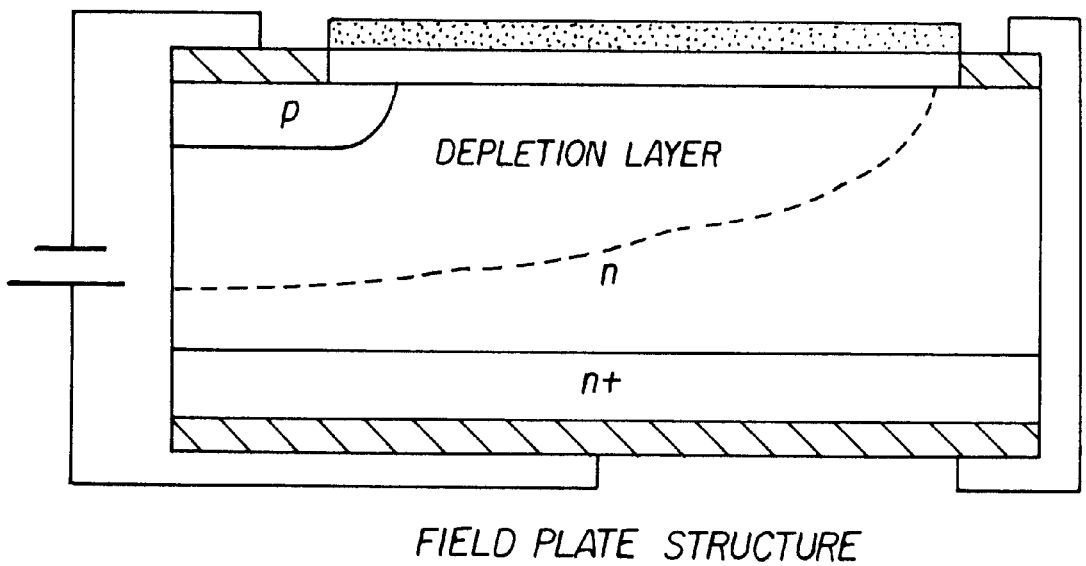

FIG. 1 is a cross sectional view of the peripheral portion of a vertical super-junction semiconductor device according to a first embodiment of the invention. Referring now to FIG. 1, there are shown an active region 10a, through that a main current flows, on the left hand side of the figure and a peripheral region 10b, that bears the breakdown voltage, on the right hand side of the figure. Since the specific feature of the invention relates to the peripheral region 10b for bearing the breakdown voltage and is independent of the types of the active region 10a, the invention will be described hereinafter in connection with a planar-type MOSFET. The specific structure according to the first embodiment is applicable also to the trench-type MOSFET as shown in FIG. 11 with no problem.

In FIG. 1, there are also shown an $n^+$-type drain layer 11 with low resistance, a first alternating conductivity type layer 12 on $n^+$-type drain layer 11 in active region 10a and a second alternating conductivity type layer on $n^+$-type drain layer 11 in peripheral region 10b. The first alternating conductivity type layer 12 is formed of n-type drift regions 12a and p-type partition regions 12b laminated alternately with each other. In the surface portion of active region 10a, a p-type well region 13a is in contact with p-type partition region 12b. In p-type well region 13a, an $n^+$-type source region 14 and a heavily doped $p^+$-type contact region 13b are formed. A polysilicon gate electrode 16 is above the extended portion of p-type well region 13a extended between $n^+$-type source region 14 and n-type drift region 12a with a gate insulation film 15 interposed therebetween. A source electrode 17 is in common contact with $n^+$-type source region 14 and $p^+$-type contact region 13b. A drain electrode 18 is on the back surface of $n^+$-type drain layer 11. An insulation film 19 is formed for surface protection and for insulation. Insulation film 19 is made of a thermally oxidized film or a phospho-silicate glass ((PSG). Source electrode 17 is often extended, as shown in the figure, above gate electrode 16 with insulation film 19 interposed therebetween. Although not illustrated, a metal film gate electrode is connected to gate electrode 16. Although a drift current flows through n-type drift regions 12a, first alternating conductivity type layer 12 formed of n-type drift regions 12a and p-type partition regions 12b laminated alternately with each other is referred to sometimes as the "drift layer 12".

In a planar arrangement, the n-type drift regions and the p-type partition regions are shaped with respective stripes extending in parallel to each other and in perpendicular to the plane of paper. In this embodiment, p-type well region 13a is shaped with a stripe extending on the p-type partition region. Alternatively, p-type well region 13a may be shaped with a stripe extending in perpendicular to the n-type drift regions and the p-type partition regions as shown in FIG. 11. In a planar cross section, the n-type drift regions or the p-type partition regions are at the knots of a net or at the lattice points of a polygonal lattice such as a triangular lattice, a rectangular lattice and a hexagonal lattice, and the p-type partition regions or the n-type drift regions are in the meshes of the net or between the lattice points of the polygonal lattice. Various arrangements are employable for arranging the n-type drift regions and the p-type partition regions with each other.

The second alternating conductivity type layer in peripheral region 10b is formed of n-type drift regions 12d, 12f, 12h, 12j and 12l, and p-type partition regions 12c, 12e, 12g, 12i, 12k and 12m.

In peripheral region 10b outside active region 10a, source electrode 17 is extended, with insulation film 19 interposed therebetween, above n-type drift region 12d, in contact with the innermost p-type partition region 12c of the second alternating conductivity type layer, with that source electrode 17 is in contact. Due to this extension of source electrode 17, the surface portion of n-type drift region 12d is affected by the potential of p-type partition region 12c and the surface electric field is relaxed.

The p-type partition region 12e is in adjacent to n-type drift region 12d. Outside p-type partition region 12e, n-type drift regions 12f, 12h and 12j and p-type partition regions 12g, 12i and 12k are laminated alternately with each other. The pair of an n-type drift region and a p-type partition region is repeated as many times as necessary to obtain a desired breakdown voltage.

For example, the dimensions and the impurity concentrations of the MOSFET exhibiting a breakdown voltage of the 400 V class are as follows. The specific resistance of $n^+$-type drain layer 11 is 0.01 Ωcm. The thickness of $n^+$-type drain layer 11 is 350 μm. The thickness of drift layer 12 is 30 μm. The widths of the n-type drift region and the p-type partition region are 10 μm (i.e. the spacing between the centers of the same conductivity type regions is 20 μm). The average impurity concentration in the n-type drift regions and the p-type partition regions is $2.5 \times 10^{15}$ cm$^{-3}$. The diffusion depth of p-type well region 13a is 1 μm. The surface impurity concentration of p-type well region 13a is $1 \times 10^{17}$ cm$^{-3}$. The diffusion depth of $n^+$-type well region 14 is 0.3 μm. The surface impurity concentration of $n^+$-type well region 14 is $1 \times 10^{20}$ cm$^{-3}$. Insulation film 19 is 1 μm in thickness when insulation film 19 is made of an oxide film. The thickness of insulation film 19 is from 0.1 to 1 μm depending on the setting value of the voltage applied to the adjacent alternating conductivity type layer. When the parameters as described above are adopted, the super-junction NOSFET shown in FIG. 1 realizes a breakdown voltage of 400 V. In other words, p-type partition regions 12e, 12g, 12i, 12k and 12m, not connected electrically to p-type partition region 12b, are floating and work as guard rings. Since n-type drift regions 12d, 12f, 12h, 12j and 12l are electrically connected to the drain electrode via $n^+$-type drain layer 11, n-type drift regions 12d, 12f, 12h, 12j and 12l are depleted almost over the entire thickness thereof by the depletion layers expanding from the pn-junctions in the second alternating conductivity type layer in the peripheral region of the device. The guard ring structure or the field plate structure depletes only the surface side of the peripheral region of the device. In contrast, the structure of the peripheral region of the device according to the first embodiment facilitates depleting not only the surface side of the peripheral region of the device but also the outer side of the device and the deep portion of the device, relaxing the electric field strength in the peripheral region of the device and securing a certain breakdown voltage. Thus, a super-junction semiconductor device with a high breakdown voltage is realized.

Second Embodiment

Figure 2:
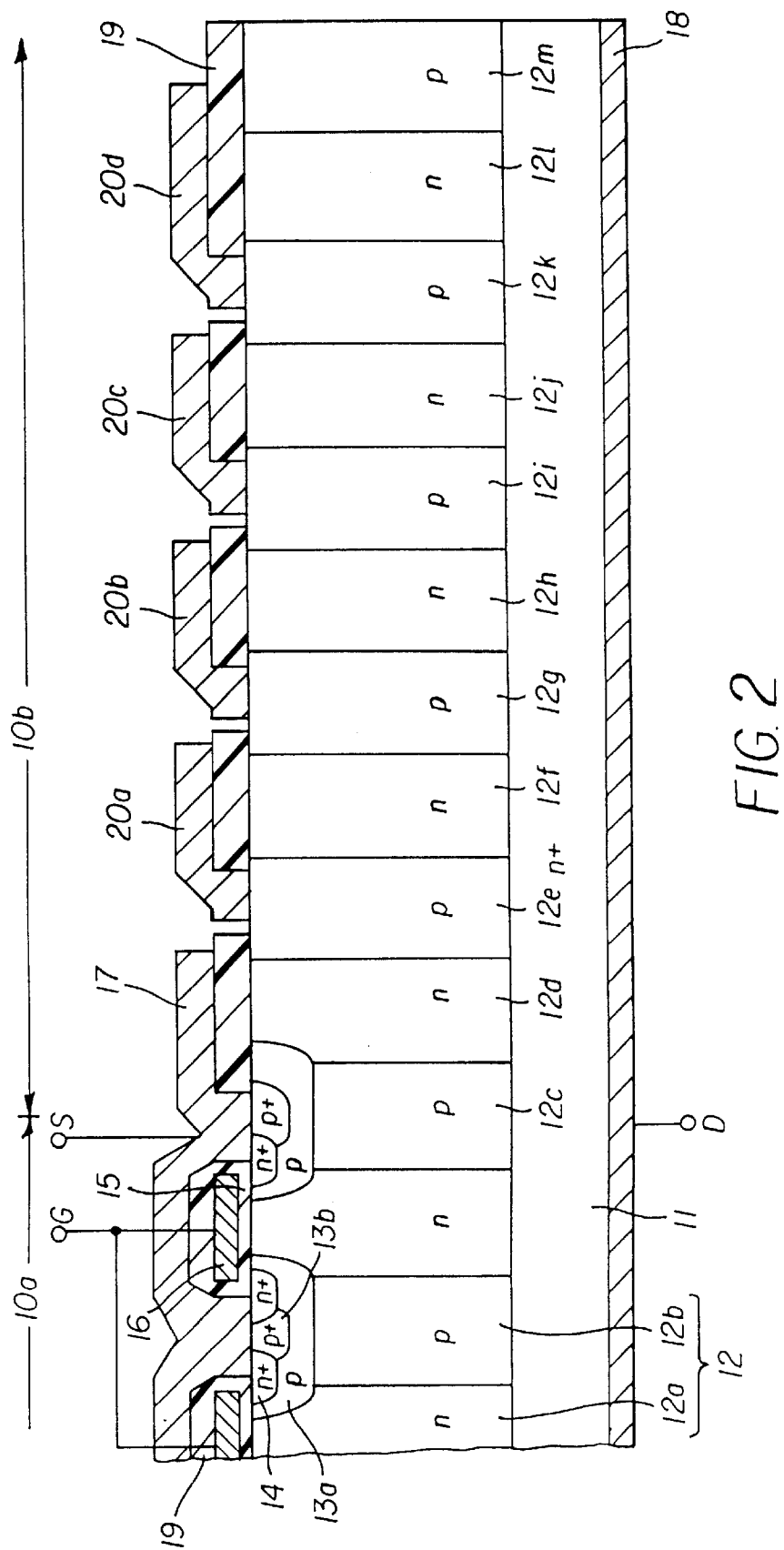
FIG. 2 is a cross sectional view of the peripheral portion of a vertical super-junction semiconductor device according to a second embodiment of the invention.

FIG. 2 is a cross sectional view of the peripheral portion of a vertical super-junction semiconductor device according to a second embodiment of the invention. Referring now to FIG. 2, there are shown an active region 10a, through that a main current flows, on the left hand side of the figure and a peripheral region 10b, that bears the breakdown voltage, on the right hand side of the figure. Since the specific feature of the invention relates to the peripheral region 10b for bearing the breakdown voltage and is independent of the types of the active region 10a, the invention will be described hereinafter in connection with a planar-type MOSFET. The specific structure according to the second embodiment is applicable also to the trench-type MOSFET as shown in FIG. 11 with no problem.

In FIG. 2, there are also shown an $n^+$-type drain layer 11 with low resistance, a first alternating conductivity type layer 12 on $n^+$-type drain layer 11 in active region 10a and a second alternating conductivity type layer on $n^+$-type drain layer 11 in peripheral region 10b. The first alternating conductivity type layer 12 is formed of n-type drift regions 12a and p-type partition regions 12b laminated alternately with each other. In the surface portion of active region 10a, a p-type well region 13a is in contact with p-type partition region 12b. In p-type well region 13a, an $n^+$-type source region 14 and a heavily doped $p^+$-type contact region 13b are formed. A polysilicon gate electrode 16 is above the extended portion of p-type well region 13a extended between $n^+$-type source region 14 and n-type drift region 12a with a gate insulation film 15 interposed therebetween. A source electrode 17 is in common contact with $n^+$-type source region 14 and $p^+$-type contact region 13b. A drain electrode 18 is on the back surface of $n^+$-type drain layer 11. An insulation film 19 is formed for surface protection and for insulation. Insulation film 19 is made of a thermally oxidized film or a phospho-silicate glass ((PSG). Source electrode 17 is often extended, as shown in the figure, above gate electrode 16 with insulation film 19 interposed therebetween. Although not illustrated, a metal film gate electrode is connected to gate electrode 16. Although a drift current flows through n-type drift regions 12a, first alternating conductivity type layer 12 formed of n-type drift regions 12a and p-type partition regions 12b laminated alternately with each other is referred to sometimes as the "drift layer 12".

In a planar arrangement, the n-type drift regions and the p-type partition regions are shaped with respective stripes extending in parallel to each other and in perpendicular to the plane of paper. In this embodiment, p-type well region 13a is shaped with a stripe extending on the p-type partition region. Alternatively, p-type well region 13a may be shaped with a stripe extending in perpendicular to the n-type drift regions and the p-type partition regions as shown in FIG. 11. In a planar cross section, the n-type drift regions or the p-type partition regions are at the knots of a net or at the lattice points of a polygonal lattice and the p-type partition regions or the n-type drift regions are in the meshes of the net or between the lattice points of the polygonal lattice. Various arrangements are employable for arranging the n-type drift regions and the p-type partition regions with each other.

The second alternating conductivity type layer in peripheral region 10b is formed of n-type drift regions 12d, 12f, 12h, 12j and 12l, and p-type partition regions 12c, 12e, 12g, 12i, 12k and 12m.

In peripheral region 10b outside active region 10a, source electrode 17 is extended, with insulation film 19 interposed therebetween, above n-type drift region 12d, in contact with an innermost p-type partition region 12c of the second alternating conductivity type layer, with that source electrode 17 is in contact. Due to this extension of source electrode 17, the surface portion of n-type drift region 12d is affected by the potential of p-type partition region 12c and the surface electric field is relaxed.

The p-type partition region 12e is in adjacent to n-type drift region 12d. And, a first field plate (FP) electrode 20a is in contact with p-type partition region 12e. First FP electrode 20a is extended above an adjacent n-type drift region 12f with an insulation film 19 interposed therebetween. Due to this specific arrangement, the surface portion of n-type drift region 12f is affected by the potential of p-type partition region 12e and the surface electric field of n-type drift region 12f is relaxed. Outside n-type drift regions 12f, p-type partition regions 12g, 12i and 12k and n-type drift region 12h 12j and 12l are laminated alternately with each other. A second FP electrode 20b, a third FP electrode 20c and a fourth FP electrode 20d are in contact with respective p-type partition regions 12g, 12i and 12k. Second through fourth FP electrodes 20b, 20c and 20d are extended, respectively, above n-type drift region 12h 12j and 12l with respective insulation films 19 interposed therebetween. The set of an n-type drift region, a p-type partition region and a FP electrode is repeated as many times as necessary to obtain a desired breakdown voltage. The super-junction MOSFET shown in FIG. 2 is provided with the first through the fourth FP electrodes. The FP electrode is made of an aluminum alloy film in the same way as source electrode 17.

For example, the dimensions and the impurity concentrations of the MOSFET shown in FIG. 2 and exhibiting a breakdown voltage of the 400 V class are as follows. The specific resistance of $n^+$-type drain layer 11 is 0.01 Ωcm. The thickness of $n^+$-type drain layer 11 is 350 μm. The thickness of drift layer 12 is 30 μm. The widths of the n-type drift region and the p-type partition region are 10 μm (i.e. the spacing between the centers of the same conductivity type regions is 20 μm). The average impurity concentration in the n-type drift regions and the p-type partition regions is $2.5 \times 10^{15}$ cm$^{-3}$. The diffusion depth of p-type well region 13a is 1 μm. The surface impurity concentration of p-type well region 13a is $1 \times 10^{17}$ cm$^{-3}$. The diffusion depth of $n^+$-type well region 14 is 0.3 μm. The surface impurity concentration of $n^+$-type well region 14 is $1 \times 10^{20}$ cm$^{-3}$. Insulation film 19 is 1 μm in thickness when insulation film 19 is made of an oxide film. The thickness of insulation film 19 is from 0.1 to 1 μm depending on the setting value of the voltage applied to the adjacent alternating conductivity type layer. When the parameters as described above are adopted, the super-junction NOSFET shown in FIG. 2 realizes a breakdown voltage of 400 V.

Figure 3:
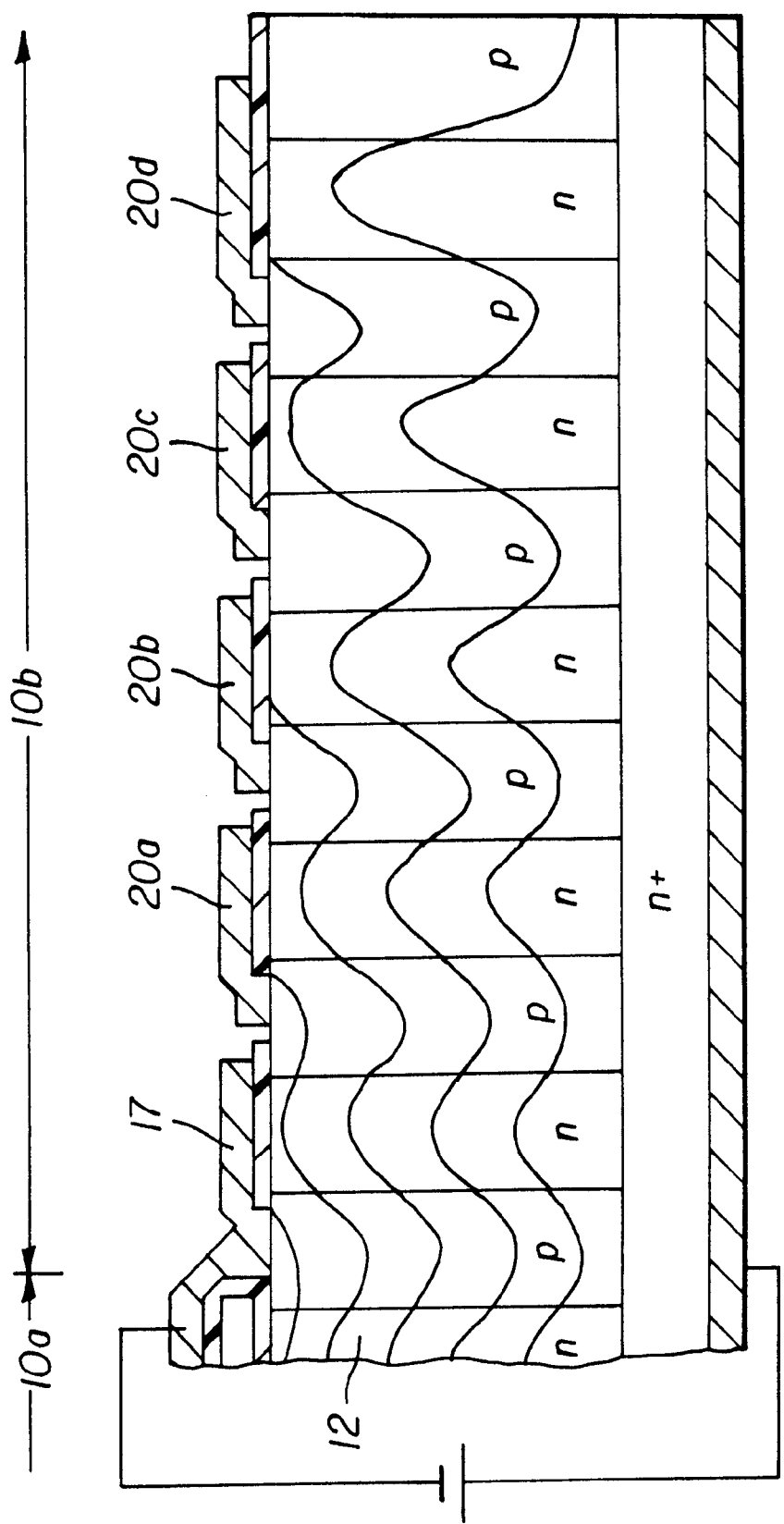
FIG. 3 is a cross sectional view for showing the potential distribution across the super-junction MOSFET of FIG. 2 caused by a voltage of 400 V applied thereto.

FIG. 3 is a cross sectional view for showing the simulated potential distribution across the super-junction MOSFET of FIG. 2 caused by a voltage of 400 V applied thereto. In the figure, equi-potential curves are drawn at every 100 V.

As FIG. 3 indicates, the equi-potential curves are extended to peripheral region 10b, and any electric field localization is not caused in the vicinity of source electrode 17. To describe in other words, the electric field is relaxed in the surface portion of the device. As described in FIG. 3, the maximum field strength is caused not in the peripheral region 10b but in first alternating conductivity type layer 12 in active region 10a.

This is very important to improve the breakdown voltage of the device. When the maximum field strength is caused in peripheral region 10b, the current localizes in a narrow area, easily causing breakdown of the device. When the maximum field strength is caused in active region 10a as shown in FIG. 3, a large area bears the maximum field strength. Even when an avalanche is caused and a current starts flowing, the current is carried by the large area and the device is not broken down.

Figure 4:
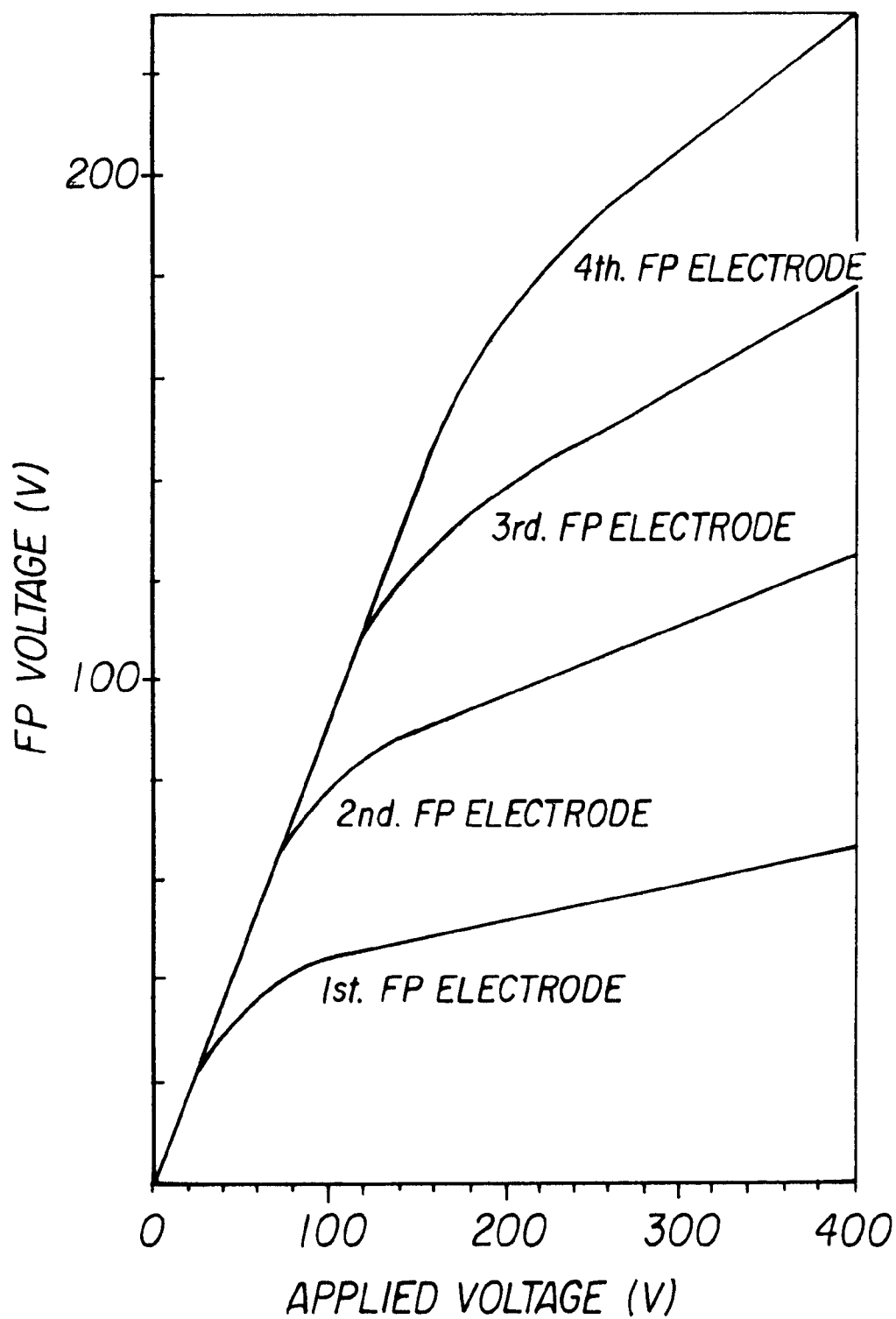
FIG. 4 is a set of curves showing the changes of the voltages shared by the FP electrodes of FIG. 2 with the applied voltage.

FIG. 4 is a set of curves showing the changes of the voltages shared by the first through the fourth FP electrodes of FIG. 2 with the applied voltage. As FIG. 4 indicates, the voltage difference between the adjacent outer FP electrodes is smaller than the voltage difference between the adjacent inner FP electrodes.

The super-junction MOSFET of FIG. 2 operates in the following manner. When a predetermined positive voltage is applied to gate electrode 16, an inversion layer is induced in the surface portion of p-type well region 13a beneath gate electrode 16 and electrons are injected from $n^+$-type source region 14 to n-type drift region 12a via the inversion layer. The injected electrons reach $n^+$-type drain layer 11, connecting drain electrode 18 and source electrode 17 electrically.

When the applied positive voltage is removed from gate electrode 16, the inversion layer induced in the surface portion of p-type well region 13a vanishes, and drain electrode 18 and source electrode 17 are disconnected electrically from each other. As the reverse bias voltage is further increased, depletion layers expand from the pn-junctions Ja between p-type well regions 13a and n-type drift regions 12a and from the pn-junctions Jb between p-type partition regions 12b and n-type drift regions 12a into n-type drift regions 12a and p-type partition regions 12b, since p-type partition regions 12b are connected with each other via p-type well regions 13a and source electrode 17. As a result, n-type drift regions 12a and p-type partition regions 12b are depleted.

Since the depletion layers from the pn-junctions Jb expand in the width direction of n-type drift regions 12a and since depletion layers also expand from the adjacent p-type partition regions 12b, n-type drift regions 12a are depleted very quickly. Therefore, the impurity concentration in n-type drift regions 12a can be increased.

At the same time, p-type partition regions 12b are also depleted. The p-type partition regions 12b are also depleted very quickly, since depletion layers expand from the pn-junctions on both sides.

For providing the conventional vertical MOSFET including a single layered highly resistive drift layer with a breakdown voltage of the 400 V class, the impurity concentration in drift layer 12 should be around $5 \times 10^{14}$ cm$^{-3}$ and the thickness of drift layer 12 should be around 30 $\mu$m. The on-resistance of the super-junction MOSFET according to the second embodiment of the invention is reduced to around one fifth of that of the conventional vertical MOSFET by increasing the impurity concentration in n-type drift regions 12a and a sufficiently high breakdown voltage is still obtained.

By narrowing n-type drift regions 12a and by further increasing the impurity concentration in n-type drift regions 12a, the on-resistance and, therefore, the tradeoff relation between the on-resistance and the breakdown voltage are further reduced.

Third Embodiment

Figure 5:
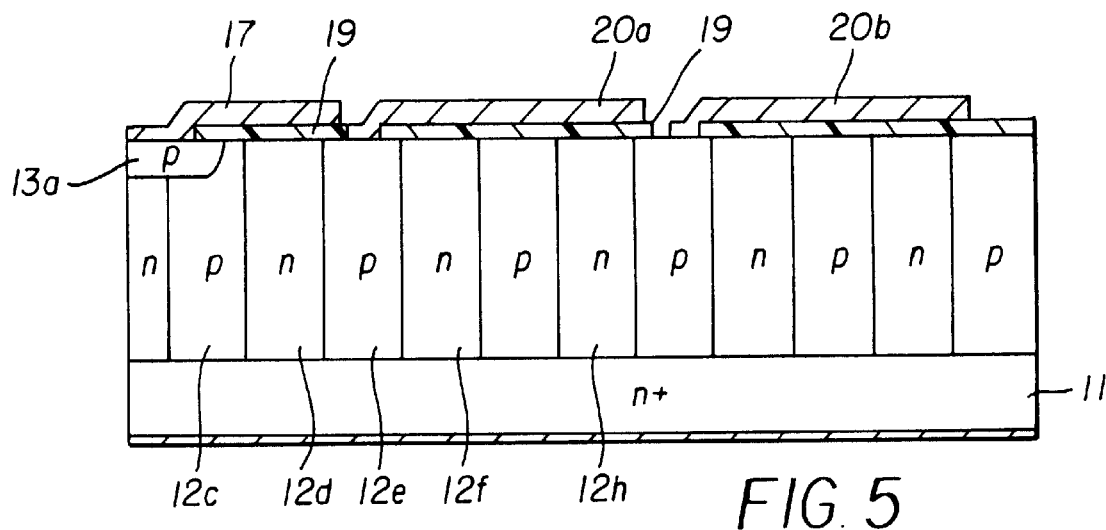
FIG. 5 is a cross sectional view of a vertical super-junction MOSFET according to a third embodiment of the invention.

FIG. 5 is a cross sectional view of a vertical super-junction MOSFET according to a third embodiment of the invention. The detail structure of the active region of the MOSFET is not shown in the figure.

Referring now to FIG. 5, source electrode 17 is extended above n-type drift region 12d adjacent to the innermost p-type partition region 12c of the second alternating conductivity type layer, with that source electrode 17 contacts, with insulation film 19 interposed therebetween in the same manner as in the second embodiment. The super-junction MOSFET according to the third embodiment is different form the super-junction MOSFET according to the second embodiment in that first FP electrode 20a, contacting with the surface of p-type partition region 12e, is extended over the next n-type drift region 12f to above the second next n-type drift region 12h with an insulation film 19 interposed therebetween in the MOSFET according to the third embodiment. A pair of a p-type partition region and an n-type drift region is provided with a FP electrode in the MOSFET according to the second embodiment. In the MOSFET according to the third embodiment, two pairs of a p-type partition region and an n-type drift region are provided with a FP electrode. In the MOSFET according to the third embodiment, the second FP electrode 20b is arranged on two pairs of a p-type partition region and an n-type drift region.

As described by the foregoing relational expression (2), the on-resistance of the super-junction MOSFET is proportional to the width d of the n-type drift region. To describe in other words, the characteristics of the super-junction MOSFET are improved by reducing the width d of the n-type drift region. However, as the width d of each n-type drift region becomes narrower, more fine and precise machining techniques should be employed. According to the third embodiment, it is not always necessary to pattern the FP electrodes so finely even when the width d of the n-type drift regions is reduced.

The number of pairs of the p-type partition region and the n-type drift region, to that one FP electrode is provided, is a design parameter that should be determined considering the setting values of the breakdown voltage and the width d. Since the inner FP electrode bears a larger voltage as described in FIG. 4, a modification, that assigns one FP electrode to two or three inner pairs of a p-type partition region and an n-type drift region and decreases the number of outer pairs of a p-type partition region and an n-type drift region for one FP electrode, may be effective.

Fourth Embodiment

Figure 6:
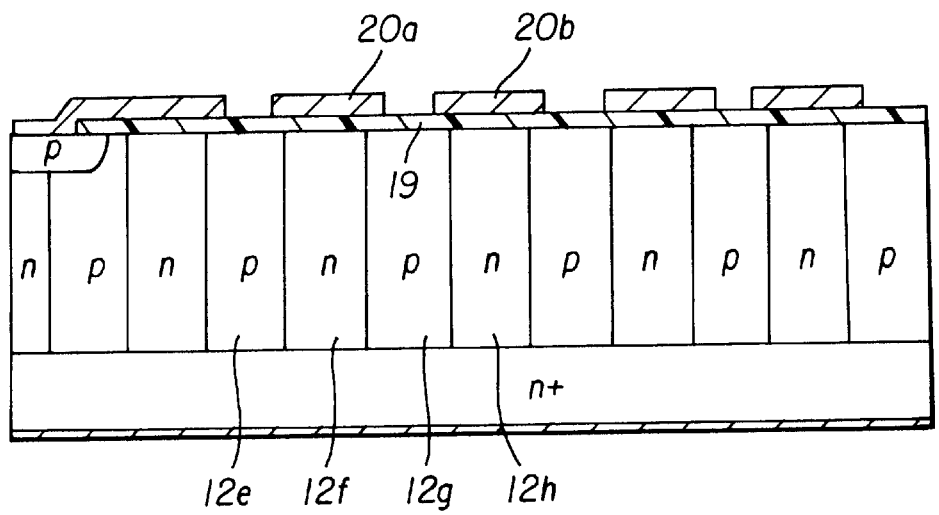
FIG. 6 is a cross sectional view of a vertical super-junction MOSFET according to a fourth embodiment of the invention.

FIG. 6 is a cross sectional view of a vertical super-junction MOSFET according to a fourth embodiment of the invention. The vertical super-junction MOSFET according to the fourth embodiment is a modification of the n-channel MOSFET according to the second embodiment shown in FIG. 2.

Referring now to FIG. 6, FP electrodes 20a and 20b are not in contact with respective partition regions 12e and 12g and arranged on an insulation film 19 on n-type drift regions 12f and 12h.

Since FP electrodes 20a and 20b are coupled electrically with each other via the capacitance of insulation film 19, the second alternating conductivity type layer is affected by the potential of FP electrodes 20a and 20b and the electric field is relaxed in the same manner as according to the second embodiment.

Since it is not necessary to bore contact holes for making the FP electrodes contact with the surfaces of the partition regions, the structure according to the fourth embodiment is especially effective for fine patterning. Alternatively, one FP electrode may be arranged above multiple pairs of a p-type partition region and an n-type drift region in the same manner as according to the third embodiment.

Fifth Embodiment

Figure 7:
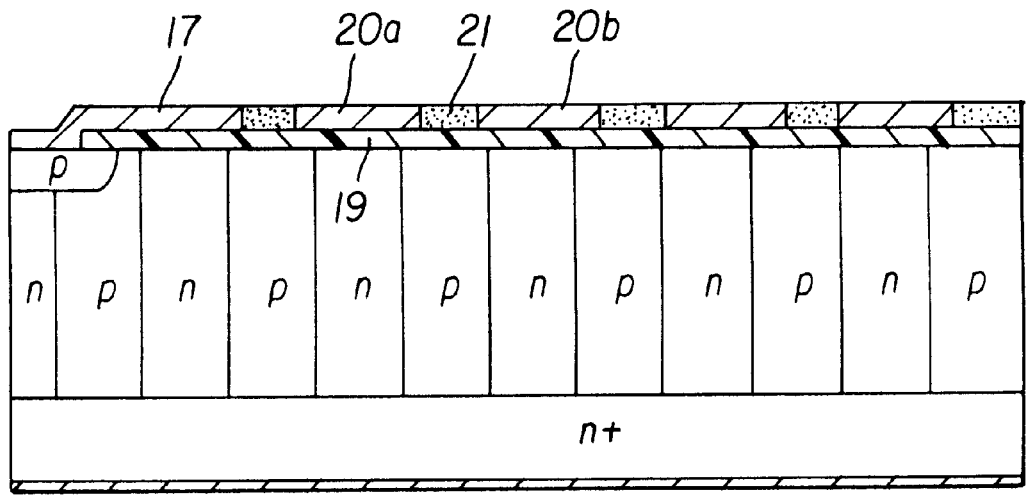
FIG. 7 is a cross sectional view of a vertical superjunction MOSFET according to a fifth embodiment of the invention.

FIG. 7 is a cross sectional view of a vertical super-junction MOSFET according to a fifth embodiment of the invention. The vertical super-junction MOSFET according to a fifth embodiment is an n-channel MOSFET.

In the MOSFET according to the fourth embodiment, the adjacent metal film FP electrodes are connected with each other via the capacitance of the insulation film. In the MOSFET according to the fifth embodiment, FP electrodes 20a and 20b are connected with each other via a resistive film 21.

The connection via resistive film 21 facilitates tightly fixing the potentials of the FP electrodes. Resistive film 21 is made of amorphous silicon, silicon rich silicon oxide or silicon nitride.

Sixth Embodiment

Figure 8:
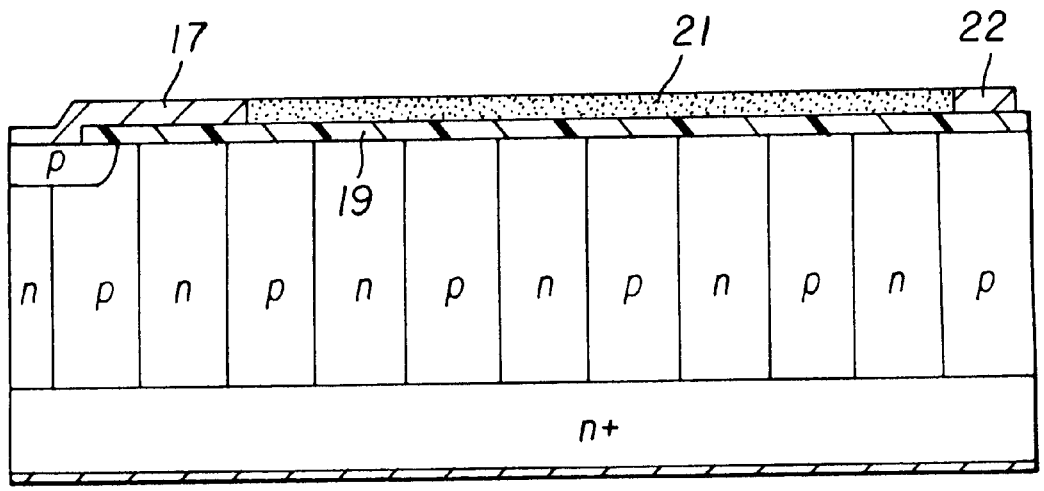
FIG. 8 is a cross sectional view of a vertical super-junction MOSFET according to a sixth embodiment of the invention.

FIG. 8 is a cross sectional view of a vertical super-junction MOSFET according to a sixth embodiment of the invention. The vertical super-junction MOSFET according to the sixth embodiment is an n-channel MOSFET.

The MOSFET according to the sixth embodiment includes a resistive film. The MOSFET according to the sixth embodiment does not include any FP electrode. In detail, a resistive film 21 is formed between source electrode 17 and a peripheral electrode 22 on the peripheral portion of the chip. Resistive film 21 is effective to provide the second alternating conductivity type layer below the resistive film 21 with a continuous potential via insulation film 19. However, since unstable control of the resistance value is often caused, it is necessary to manage the manufacturing process strictly.

Seventh Embodiment

The invention have been explained so far in connection with the peripheral structures parallel to the second alternating conductivity type layer. In the super-junction MOSFET's according to the foregoing embodiments, stabilizing treatment is applied to the side face of the second alternating conductivity type layer.

If the side face of the second alternating conductivity type layer is left untreated after being cut by dicing, a leakage current will flow from the as cut face to source electrode 17 via the p-type partition regions, causing leakage current increase.

The super-junction MOSFET according to a seventh embodiment of the invention has a vertical peripheral structure that surely provides the MOSFET with a high breakdown voltage.

Figure 9:
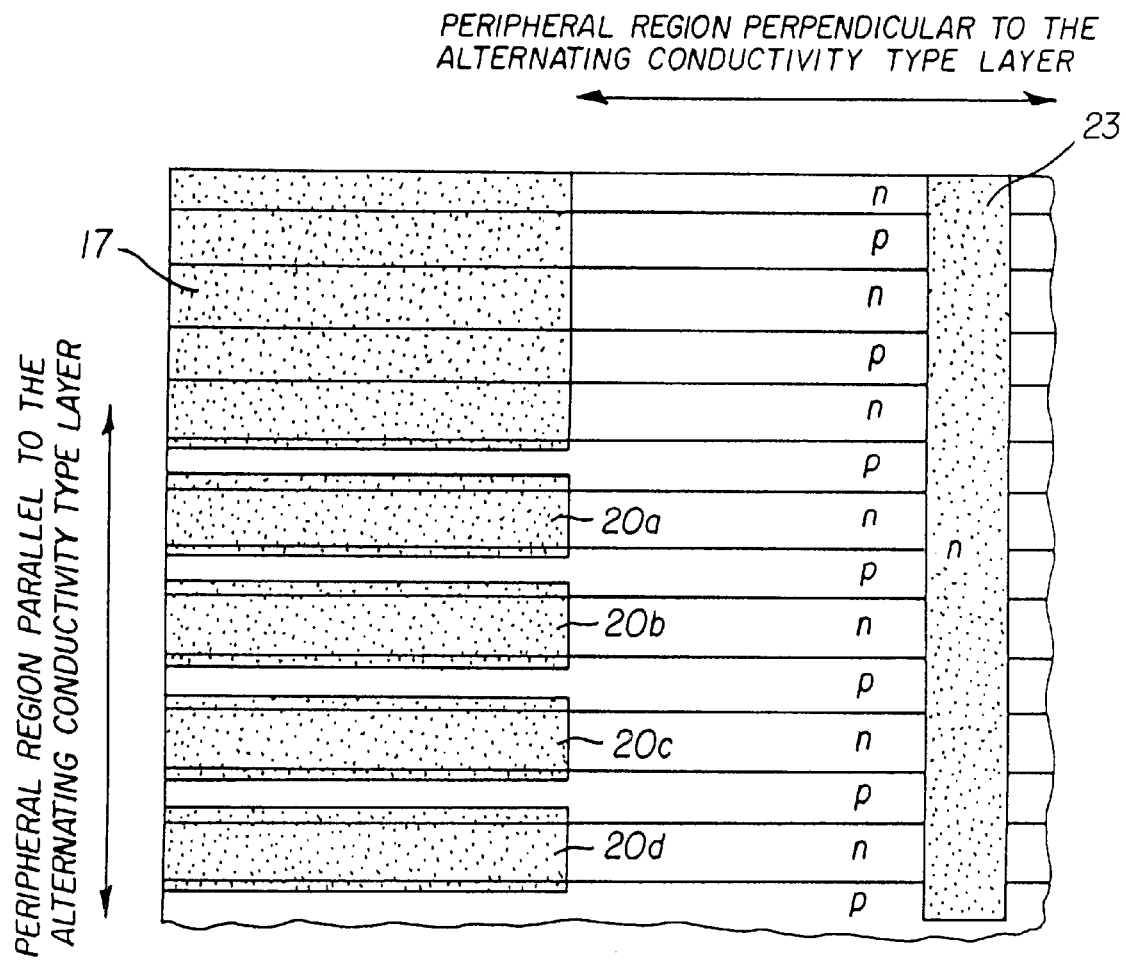
FIG. 9 is a plan view of the edge portion of a super-junction MOSFET according to a seventh embodiment of the invention.
Figure 10:
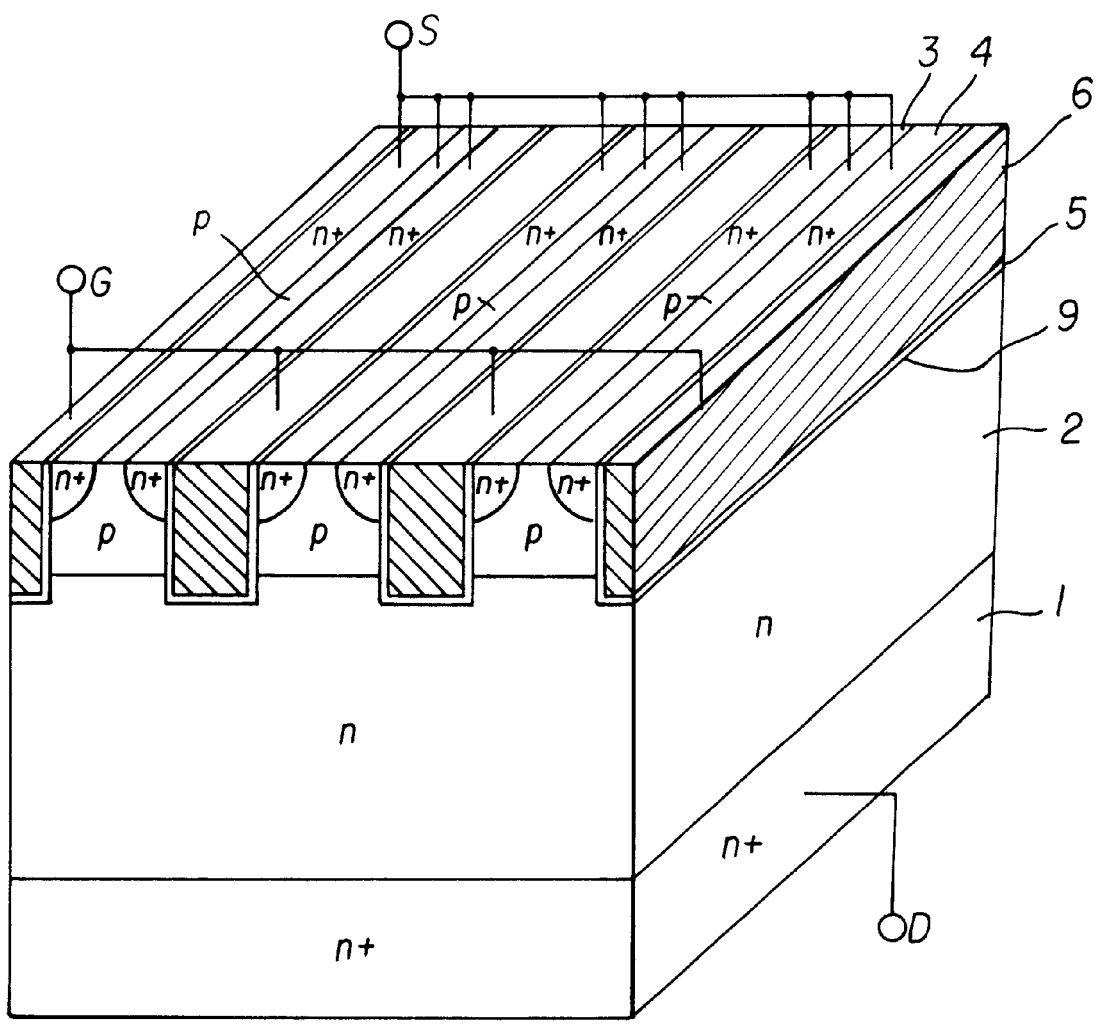
FIG. 10 is a perspective cross sectional view of a conventional vertical MOSFET.

FIG. 9 is a plan view of the edge portion of the super-junction MOSFET according to the seventh embodiment of the invention. The MOSFET according to the seventh embodiment has the same peripheral structure parallel to the second alternating conductivity type layer with that of the MOSFET according to the second embodiment. In detail, the MOSFET according to the seventh embodiment includes first through fourth FP electrodes 20a through 20d. Referring now to FIG. 9, the zigzag edges represent the surfaces having many defects caused by dicing.

An n-type region (hereinafter referred to as a "stopper region") 23 is formed in the peripheral region in perpendicular to the regions of the alternating conductivity types. The n-type stopper region 23 is deep enough to reach $n^+$-type drain region 11. The n-type stopper region 23 is 5 m in width. The impurity concentration in n-type stopper region 23 is equal to or lower than that in n-type drift region 12a.

The n-type stopper region 23 facilitates preventing a leakage current from flowing into source electrode 17.

Alternatively, a plurality of n-type stopper region 23 is formed at an appropriate interval of from 100 to 500 $\mu$m.

The n-type stopper region 23 is applicable not only to the MOSFET according to the second embodiment also to the MOSFET's according to the third through the sixth embodiments. When n-type stopper region 23 is applied to the super-junction MOSFET's according to the fifth embodiment and the sixth embodiment, it is not necessary to form an additional vertical resistive film.

Although the invention has been described in connection with the n-channel MOSFET, the invention is applicable to IGBT's, pn-diodes, Schottky barrier diodes, and bipolar transistors without impairing its excellent effects.

In the super-junction semiconductor device according to the invention including a first alternating conductivity type layer, that provides a current path when the device is ON and is depleted when the device is OFF, formed of drift regions of the first conductivity type and partition regions of the second conductivity type laminated alternately with each other, a peripheral structure including a second alternating conductivity type layer is arranged also around the active region. Due to the peripheral structure according to the invention, depletion layers expand from multiple pn-junction planes in the OFF-state of the device and deplete not only the vicinity of the active region but also the outer region and the region on the second main electrode side. Therefore, the breakdown voltage in the peripheral region of the device is increased and higher than that in the active region of the device. Since the breakdown voltage in the peripheral region of the device is well guaranteed for the super-junction semiconductor device including a first alternating conductivity type drift layer formed of vertical drift regions and vertical partition regions laminated alternately with each other, the structure of the first alternating conductivity type layer is optimized easily, the freedom for designing super-junction semiconductor devices is increased and practical super-junction semiconductor devices are developed.

The arrangement of one or more FP electrodes on the second alternating conductivity type layer outside the active region of the device facilitates relaxing the surface electric field and realizing a high breakdown voltage.

The FP electrodes are make contact with the respective partition regions of the second conductivity type or floated from the respective partition regions of the second conductivity type. One FP electrode may be arranged over a plurality of the drift region of the first conductivity type. The resistance formed between the adjacent FP electrodes is useful to fix the potentials of the FP electrodes.

The stopper region of the first conductivity type, formed vertically and deep enough to reach the layer with low electrical resistance, facilitates surely realizing a high breakdown voltage. The stopper region of the first conductivity type works as a channel stopper for preventing surface inversion from causing. Since the stopper region covers the side face of the second alternating conductivity type layer in the peripheral region of the device, the side face of the second alternating conductivity type layer is not exposed as a dicing face of the chip, the leakage current is suppressed, the potential around the second alternating conductivity type layer in the peripheral region of the device is kept at the drain potential, the dielectric breakdown voltage of the device is stabilized, and the quality of the device is improved.

The present invention is very effective to realize a super-junction semiconductor device exhibiting a high breakdown voltage.

What is claimed is:

1. A super-junction semiconductor device comprising:
   a semiconductor chip having a first major surface and a second major surface facing opposite to the first major surface, the semiconductor chip including an active region and a peripheral region that bears the breakdown voltage and surrounding the active region;
   a first main electrode and a second main electrode on the first major surface on the active region;
   a third main electrode on the second major surface;
   a layer with low electrical resistance extending on the side of the second major surface from the active region to the peripheral region;
   a first alternating conductivity type layer on the layer with low electrical resistance in the active region, the first alternating conductivity type layer providing a current path in the ON-state of the semiconductor device and being depleted in the OFF-state of the semiconductor device, the first alternating conductivity type layer comprising drift regions of a first conductivity type and partition regions of a second conductivity type, the drift regions and the partition regions being laminated alternately with each other; and
   a second alternating conductivity type layer on the layer with low electrical resistance in the peripheral region, the second alternating conductivity type layer comprising drift regions of the first conductivity type and partition regions of the second conductivity type, the drift regions and the partition regions being laminated alternately with each other.

2. The super-junction semiconductor device according to claim 1, wherein the drift regions and the partition regions in the first alternating conductivity type layer and the drift regions and the partition regions in the second alternating conductivity type layer extend in perpendicular to the first major surface.

3. The super-junction semiconductor device according to claim 1, wherein the first alternating conductivity type layer and the second alternating conductivity type layer are continuous to each other.

4. The super-junction semiconductor device according to claim 1, wherein the impurity concentrations in the drift regions and the partition regions in the second alternating conductivity type layer are equal to the respective net impurity concentrations in the drift regions and the partition regions in the first alternating conductivity type layer.

5. The super-junction semiconductor device according to claim 1, wherein the drift regions and the partition regions in the second alternating conductivity type layer and the drift regions and the partition regions in the first alternating conductivity type layer are shaped with respective planar stripes extending in parallel to each other.

6. The super-junction semiconductor device according to claim 1, wherein the drift regions in the first alternating conductivity type layer and in the second alternating conductivity type layer or the partition regions in the first alternating conductivity type layer and in the second alternating conductivity type layer are located at the lattice points of a planar polygonal lattice.

7. The super-junction semiconductor device according to claim 1, the super-junction semiconductor device further comprising an insulation film covering at least a part of the second alternating conductivity type layer.

8. The super-junction semiconductor device according to claim 1, the super-junction semiconductor device further comprising an insulation film covering the adjacent portion of the second alternating conductivity type layer adjacent to the first alternating conductivity type layer, the insulation film being covered by the second main electrode.

9. The super-junction semiconductor device according to claim 1, the super-junction semiconductor device further comprising one or more insulation films on the second alternating conductivity type layer and one or more field plate electrodes on the one or more insulation films.

10. The super-junction semiconductor device according to claim 1, the super-junction semiconductor device further comprising an insulation film on the second alternating conductivity type layer and a resistive film on the insulation film.

11. The super-junction semiconductor device according to claim 1, the super-junction semiconductor device further comprising a channel stopper region of the first conductivity type in the outer portion of the peripheral region.

12. A super-junction semiconductor device as claimed in claim 1,
   wherein the first alternating conductivity type layer extends from the first major surface to the layer with low electrical resistance.

13. The super-junction semiconductor device according to claim 5, wherein the widths of the drift regions and the partition regions in the second alternating conductivity type layer are almost equal to the respective widths of the drift regions and the partition regions in the first alternating conductivity type layer.

14. The super-junction semiconductor device according to claim 5, the super-junction semiconductor device further comprising a channel stopper region of the first conductivity type, the channel stopper region extending in perpendicular to the stripes of the drift regions and the partition regions in the first alternating conductivity type layer and in the second alternating conductivity type layer.

15. The super-junction semiconductor device according to claim 10, wherein the one or more field plate electrodes are in contact with the respective one or more partition regions in the second alternating conductivity type layer.

16. The super-junction semiconductor device according to claim 10, wherein the one or more field plate electrodes are extended over one or more drift regions in the second alternating conductivity type layer.

17. The super-junction semiconductor device according to claim 10, wherein the potential of each of the one or more field plate electrodes is floated.

18. The super-junction semiconductor device according to claim 10, the super-junction semiconductor device further comprising a resistive film between the adjacent field plate electrodes.

19. The super-junction semiconductor device according to claim 16, wherein the channel stopper region is extended deeply enough to reach the layer with low electrical resistance.

20. The super-junction semiconductor device according to claim 16, wherein the channel stopper region and the partition regions form pn-junctions therebetween.

21. The super-junction semiconductor device according to claim 16, wherein one or more of the partition regions are surrounded by the channel stopper region and the drift regions in a cross section parallel to the first major surface.

22. The super-junction semiconductor device according to claim 16, wherein the impurity concentration in the channel stopper regions is equal to or lower than the impurity concentration in the drift regions.

* * * * *